(12) United States Patent
Li et al.

(10) Patent No.: US 11,795,100 B2
(45) Date of Patent: Oct. 24, 2023

(54) COMPOSITION FOR GLASS, AND ALUMINOSILICATE GLASS, PREPARATION METHOD THEREFOR, AND USE THEREOF

(71) Applicants: TUNGHSU TECHNOLOGY GROUP CO., LTD., Beijing (CN); TUNGHSU GROUP CO., LTD., Shijiazhuang (CN)

(72) Inventors: Qing Li, Shijiazhuang (CN); Guangtao Zhang, Shijiazhuang (CN); Junfeng Wang, Shijiazhuang (CN); Xiaoyi Wang, Shijiazhuang (CN); Dongcheng Yan, Shijiazhuang (CN); Lihong Wang, Shijiazhuang (CN); Quan Zheng, Shijiazhuang (CN)

(73) Assignees: TUNGHSU TECHNOLOGY GROUP CO., LTD., Beijing (CN); TUNGHSU GROUP CO., LTD., Shijiazhuang (CN)

( * ) Notice: Subject to any disclaimer, the term of this patent is extended or adjusted under 35 U.S.C. 154(b) by 577 days.

(21) Appl. No.: 16/772,671

(22) PCT Filed: Nov. 14, 2018

(86) PCT No.: PCT/CN2018/115460
§ 371 (c)(1),
(2) Date: Jun. 12, 2020

(87) PCT Pub. No.: WO2019/114486
PCT Pub. Date: Jun. 20, 2019

(65) Prior Publication Data
US 2020/0325062 A1 Oct. 15, 2020

(30) Foreign Application Priority Data

Dec. 13, 2017 (CN) .................. 201711330222.X

(51) Int. Cl.
| | |
|---|---|
| *C03C 3/097* | (2006.01) |
| *C03C 3/095* | (2006.01) |
| *G02F 1/1333* | (2006.01) |
| *H01L 31/0392* | (2006.01) |
| *H10K 77/10* | (2023.01) |
| *H10K 102/00* | (2023.01) |

(52) U.S. Cl.
CPC .............. *C03C 3/097* (2013.01); *C03C 3/095* (2013.01); *G02F 1/133305* (2013.01); *H01L 31/03926* (2013.01); *H10K 77/111* (2023.02); *H10K 2102/311* (2023.02)

(58) Field of Classification Search
None
See application file for complete search history.

(56) References Cited

U.S. PATENT DOCUMENTS

| | | | | |
|---|---|---|---|---|
| 2014/0376868 | A1* | 12/2014 | Ritter ................... | C03C 3/118 423/618 |
| 2015/0016140 | A1* | 1/2015 | Weingaertner ......... | C03C 3/093 362/555 |
| 2018/0186685 | A1* | 7/2018 | Murayama ............. | C03C 3/085 |
| 2021/0380471 | A1* | 12/2021 | Zhang .................... | C03C 3/095 |

FOREIGN PATENT DOCUMENTS

| | | | | |
|---|---|---|---|---|
| CN | 101066836 | A | 11/2007 | |
| CN | 101092280 | A | 12/2007 | |
| CN | 101092280 | B * | 1/2012 | ............. C03C 3/091 |
| CN | 101092280 | B | 1/2012 | |
| CN | 105859128 | A | 8/2016 | |
| CN | 108129020 | A | 6/2018 | |
| JP | H04292435 | A | 10/1992 | |
| JP | 2006036626 | A | 2/2006 | |
| KR | 20170008278 | A | 1/2017 | |

OTHER PUBLICATIONS

ISA State Intellectual Property Office of the People's Republic of China, International Search Report Issued in Application No. PCT/CN2018/115460, dated Feb. 12, 2019, WIPO, 3 pages.
Korean Intellectual Property Office, Office Action Issued in Application No. 2020-7019357, dated Jun. 7, 2022, 18 pages.
Korean Intellectual Property Office, Office Action Issued in Application No. 10-2020-7019357, dated Apr. 6, 2023, 18 pages.

* cited by examiner

*Primary Examiner* — Chris H Chu
(74) *Attorney, Agent, or Firm* — McCoy Russell LLP

(57) ABSTRACT

A composition for glass, and aluminosilicate glass, preparation method therefor, and use thereof. In molar percentage, in the composition, the total content of $SiO_2$, $B_2O_3$, $P_2O_5$, $GeO_2$ and $TeO_2$ is 60~85 mol %; the total content of $Al_2O_3$ and $Ga_2O_3$ is 3~20 mol %; the total content of ZnO and $Y_2O_3$ is 0.1~5 mol %; and the total content of alkaline earth metal oxide is 4~30 mol %. The glass has a high strain point, a low melting temperature, and a high thermal expansion coefficient, has good toughness, and is suitable for large-scale industrial production.

8 Claims, No Drawings

COMPOSITION FOR GLASS, AND ALUMINOSILICATE GLASS, PREPARATION METHOD THEREFOR, AND USE THEREOF

CROSS-REFERENCE TO RELATED APPLICATIONS

The present application is a U.S. National Phase of International Patent Application Serial No. PCT/CN2018/115460 entitled "COMPOSITION FOR GLASS, AND ALUMINOSILICATE GLASS, PREPARATION METHOD THEREFOR, AND USE THEREOF," filed on Nov. 14 2018. International Patent Application Serial No. PCT/CN2018/115460 claims priority to Chinese Patent Application No. 201711330222.X filed on Dec. 13, 2017. The entire contents of each of the above-referenced applications are hereby incorporated by reference for all purposes.

TECHNICAL FIELD

The present disclosure relates to the field of glass preparation, in particular a composition for glass, aluminosilicate glass, preparation method therefor, and use thereof.

BACKGROUND AND SUMMARY

With the popularity of smart phones and tablet computers, the mobile intelligence era has begun. Intelligent devices, including smart phones and tablet computers, have the similar performances to the laptops at present. For this reason, people can carry out high-level business and enjoy entertainment activities with the convenience of wireless communication all the time. In such a trend, the demand for display performance is improving increasingly, especially for the image quality of the mobile intelligent device, and the requirements of outdoor visibility are also improving. Meanwhile, it is an inevitable trend to make the products lighter and thinner to alleviate the using burden of handheld devices. Under the guidance of this development trend, the display panels are developing towards thin and light, and ultra-high definition display, and the panel processing technology is developing towards the higher processing temperature. Moreover, the thickness of single glass is 0.25 mm, 0.2 mm and 0.1 mm thick or even thinner after processing. However, as the thickness of a glass substrate decreases greatly, the mechanical strength of the display panel has reduced greatly when it is boxed, the ability to resist drop and impact has been seriously challenged, and the bending test fails frequently in the course of manufacturing the panel. Hence, one of the important topics is to improve the fracture toughness of the glass substrate and reduce the fragility of the glass material during the formula research.

On the other hand, the substrate of a flexible display device can be made of glass, organic polymer, metal and other materials. The existing materials have their own advantages and disadvantages in performance. At present, there is no material with high strength and high toughness. Organic polymer flexible substrates have the advantages of low cost and easy manufacturing, but there are some disadvantages in heat resistance. For instance, the optimized polyimide (Polyimide, referred to as PI) has a high temperature resistance over 400° C., but cannot still meet the requirements of 600° C. high temperature processing during the low temperature polysilicon (LTPS) process. Compared with the flexible materials, such as polymer and metal foil, an ultra-thin glass with a thickness of less than 0.1 mm is a kind of glass material with a highly optimized formula. It has excellent performance of resisting vapor and oxygen, good chemical resistance and mechanical property, and low thermal expansion and high thermal stability. Its greatest advantage lies in the maturity and compatibility of the coating technology. At present, the mainstream active matrix liquid crystal display (AMLCD) and active matrix organic light-emitting diode (AMOLED) panel are provided with thin film transistors (TFT) on the glass substrates thereof. With the mature relevant technologies, equipment and industrial chains and very ideal compatibility, the production cost will be reduced greatly and necessarily. Although the flexible glass substrate cannot be folded, folding devices are not required in all application scenarios. There is still a high demand for non-folding flexible photoelectric devices.

It is worth noting that the problems required to be broken through for an ultra-thin glass are to lower fragility and expand advantages thereof in its formula due to its fragility. On the other hand, providing the flexible glass substrate with high heat resistance is conducive to the smooth implementation of the LTPS technology and so on, for instance, when the strain point is higher than 600° C., 640° C., or even 680° C. For flexible encapsulated cover plate materials, an ultra-thin flexible alkali-free glass cover plate with low fragility has better strength and air tightness than those of the polymer materials, but there are also fragility problems which cannot be avoided by the glass materials. Hence, one of the important problems to be solved are to reduce fragility and improve toughness in the formula.

The present disclosure aims to provide a glass composition for preparing aluminosilicate glass, aluminosilicate glass, preparation method therefor, and use thereof.

BRIEF DESCRIPTION OF EMBODIMENTS

For the purpose of achieving the above purpose, a first aspect of the present disclosure provides a composition for glass, in molar percentage, the total content of $SiO_2$, $B_2O_3$, $P_2O_5$, $GeO_2$ and $TeO_2$ is 60~85 mol %; the total content of $Al_2O_3$ and $Ga_2O_3$ is 3~20 mol %; the total content of ZnO and $Y_2O_3$ is 0.1~5 mol %; and the total content of alkaline earth metal oxide is 4~30 mol %.

Optionally, the alkaline earth metal oxide is selected from any one or more of MgO, CaO, SrO and BaO.

Optionally, in molar content, the sum of the contents of $B_2O_3$ and $P_2O_5$ is greater than 0, and the ratio of the sum of the contents of $B_2O_3$ and $P_2O_5$ to the sum of the contents of $B_2O_3$, $P_2O_5$, $GeO_2$ and $TeO_2$ is 0.6~1;

in molar content, the ratio of the content of $Al_2O_3$ to the sum of the contents of $Al_2O_3$ and $Ga_2O_3$ is 0.7~1;

in molar content, the ratio of the sum of the contents of MgO and BaO to the sum of the contents of MgO, CaO, SrO and BaO is greater than 0.5.

Optionally, in molar content, the sum of the contents of $B_2O_3$ and $P_2O_5$ to the sum of the contents of $B_2O_3$, $P_2O_5$, $GeO_2$ and $TeO_2$ is 0.68~0.92.

Optionally, in molar percentage, the content of $SiO_2$ is 40 mol % or higher;

preferably, in molar percentage, the content of $B_2O_3$ is 0~20 mol %;

preferably, in molar percentage, the content of $P_2O_5$ is 0~17 mol %;

preferably, in molar percentage, the content of $GeO_2$ is 0~4 mol %;

preferably, in molar percentage, the content of $TeO_2$ is 0~5 mol %;

preferably, in molar percentage, the content of $Al_2O_3$ is 3~18 mol %;

preferably, in molar percentage, the content of $Ga_2O_3$ is 0~4 mol %;

preferably, in molar percentage, the content of ZnO is 0~2.5 mol %;

preferably, in molar percentage, the content of $Y_2O_3$ is 0~3 mol %.

Optionally, in molar percentage, the total content of $Al_2O_3$ and $Ga_2O_3$ is 5~17 mol %.

Optionally, in molar percentage, a value D of a fragile factor calculated by Formula (I) is within the range of from −5 to 40, $$D=P_1\times(B_2O_3+P_2O_5+0.5\times GeO_2+0.5\times TeO_2)+P_2\times(1.5\times Y_2O_3+ZnO)+P_3\times(MgO+BaO)+P_4\times(1.5\times CaO+SrO)+P_5\times(Al_2O_3+Ga_2O_3)+P_6\times SiO_2; \quad \text{Formula (I):}$$

in Formula (I), $P_1$ is within the range of from −2 to 0; $P_2$ is within the range of from −5 to −2; $P_3$ is within the range of from −2 to −1; $P_4$ is within the range of from 0 to 1.5, $P_5$ is within the range of from 1.5 to 3; $P_6$ is within the range of from 0 to 0.5, wherein $SiO_2$, $B_2O_3$, $P_2O_5$, $GeO_2$, $TeO_2$, $Al_2O_3$, $Ga_2O_3$, ZnO, $Y_2O_3$, MgO, CaO, SrO and BaO are all shown in molar percentage in the composition;

preferably, D is within the range of from −2.1 to 32; further preferably, D is within the range of from 2 to 19.

A second aspect of the present disclosure provides a method for preparing an aluminosilicate glass, wherein the method comprises sequentially the steps of melting, forming, annealing and mechanically processing the composition for glass according to the first aspect of the present disclosure.

Optionally, the method further comprises conducting secondary melting and thinning for a product obtained by mechanical processing, and the conditions of the secondary melting and thinning process are such that the thickness of the prepared glass is less than 0.1 mm, preferably, the viscosity thereof is $10^{5.5}$~$10^7$ P at 900~1,200° C. in a stretch-forming area.

A third aspect of the present disclosure provides an aluminosilicate glass prepared by using the above method.

Optionally, for the aluminosilicate glass, the thermal expansion coefficient is less than $40\times 10^{-7}$/° C. in the range of 50~350° C., the strain point temperature is higher than 700° C., the melting temperature $T_m$ corresponding to the viscosity of 200 poises is lower than 1,550° C., the difference between the forming temperature $T_4$ and the liquidus temperature $T_1$ is higher than 90° C., and the Young's modulus is less than 80 GPa;

optionally, the fracture toughness $K_{IC}$ of the aluminosilicate glass is greater than 1.0 MPa·m$^{1/2}$; further preferably, $K_{IC}$ is greater than 2.8 MPa·m$^{1/2}$.

Optionally, the aluminosilicate glass has a thickness of 0.05 mm and a curvature radius of less than 3.5 cm.

A fourth aspect of the present disclosure provides the uses of the composition for glass according to the present disclosure or the aluminosilicate glass according to the present disclosure in the preparation of a display device and/or a solar cell, preferably in the preparation of the materials of a substrate glass substrate and/or a glass film material for screen surface protection for the panel display product, a substrate glass substrate and/or a surface encapsulated glass and/or a glass film material for screen surface protection for the flexible panel display product, and a substrate glass substrate for the flexible solar cell.

The composition for glass provided by the present disclosure is a glass formula with a good fracture toughness, belonging to the aluminosilicate glass system. It is suitable for various conventional glass manufacturing methods such as float process, overflow process, rolling process and down-draw process, to produce flat glass with a thickness of >0.1 mm or flexible glass with a thickness of <0.1 mm (i.e., the flexible glass with a thickness of <0.1 mm obtained by a one-step processing method), or methods apply to secondary melting and thinning, to produce flexible glass with a thickness of <0.1 mm. The glass prepared by the present disclosure has a high strain point, a low melting temperature, a high thermal expansion coefficient, and meanwhile has good toughness, and thus is applicable to large-scale industrial production.

According to a preferred implementation of the present disclosure, the composition for glass, in molar percentage, contains 40 mol % of $SiO_2$ or more. The composition for glass contains the specific contents of $SiO_2$, $B_2O_3$, $P_2O_5$, $GeO_2$, $TeO_2$, $Al_2O_3$, $Ga_2O_3$, ZnO, $Y_2O_3$ and alkaline earth metal oxides. For the glass prepared by the composition for glass, the fracture toughness $K_{IC}$ is greater than 1.0 MPa·m$^{1/2}$, the thermal expansion coefficient is lower than $40\times 10^{-7}$/° C. within the range of 50~350° C., the strain point temperature is higher than 700° C., the melting temperature $T_m$ corresponding to the viscosity of 200 poises is lower than 1,550° C., the difference between the forming temperature $T_4$ and the liquidus temperature $T_1$ is higher than 90° C., and the Young's modulus is less than 80 GPa. The product is low in fragility and strong in toughness. The prepared product can be flexible glass with a thickness of 0.05 mm and a curvature radius of less than 3.5 cm.

The composition for glass or the aluminosilicate glass provided by the present disclosure can be used in the preparation of display devices and/or solar cells, particularly in the preparation of materials of a substrate glass substrate and/or a glass film material for screen surface protection for panel display products, a substrate glass substrate and/or a surface encapsulated glass and/or a glass film materials for screen surface protection for panel display products, a substrate glass substrates for flexible solar cells, and other uses requiring the glass materials with low fragility and high toughness.

Other features and advantages of the present disclosure will be elaborated in the subsequent detailed description.

DETAILED DESCRIPTION

The specific implementations of the present disclosure will be described as below in detail. It should be understood that the embodiments depicted herein are only used for stating and explaining the disclosure, without any limit to the disclosure.

The first aspect of the present disclosure provides a composition for glass, in molar percentage, in the composition, the total content of $SiO_2$, $B_2O_3$, $P_2O_5$, $GeO_2$ and $TeO_2$ is 60~85 mol %; the total content of $Al_2O_3$ and $Ga_2O_3$ is 3~20 mol %; the total content of ZnO and $Y_2O_3$ is 0.1~5 mol %; and the total content of alkaline earth metal oxide is 4~30 mol %.

In the composition for glass provided by the present disclosure, $SiO_2$ is used as a matrix consisting a network structure. The addition of $SiO_2$ can improve the heat resistance and chemical durability of the glass, make the glass less likely to devitrify, and contribute to the vitrification process. However, excessive $SiO_2$ will raise the melting temperature and increase the fragility, thereby proposing too high requirements for the production process.

In the composition for glass provided by the present disclosure, $B_2O_3$, $P_2O_5$, $GeO_2$ and $TeO_2$ are used as the matrix for constituting the aluminosilicate glass to separately generate the glass. Their addition can lower the fragility of the glass. In the meantime, $B_2O_3$, $P_2O_5$, $GeO_2$ and $TeO_2$ are good cosolvents capable of greatly lowering the melting temperature of the glass, thereby benefiting the vitrification process. However, the low-temperature viscosity of the glass will be reduced by excessive $GeO_2$ and $TeO_2$. Hence, preferably, in molar percent, the sum of the contents of $B_2O_3$ and $P_2O_5$ is greater than 0, and a ratio of the sum of the contents of $B_2O_3$ and $P_2O_5$ to the sum of the contents of $B_2O_3$, $P_2O_5$, $GeO_2$ and $TeO_2$ is 0.6~1; particularly preferably, the ratio is 0.68~0.92.

In the research, the inventor of the present disclosure further found that the mechanical property and chemical resistant property of the prepared glass can be further improved when the content of $SiO_2$ is 40 mol % or more in molar percentage. Hence, for the purpose of further improving the comprehensive performance and lowering the fragility of the glass prepared, preferably, in molar percentage, the content of $SiO_2$ is 40 mol % or more, and the total content of $SiO_2$, $B_2O_3$, $P_2O_5$, $GeO_2$ and $TeO_2$ is 65~80 mol %. Particularly preferably, the content of $SiO_2$ is 44 mol % or more but less than 72 mol %.

In the composition for glass provided by the present invention, $Al_2O_3$ can be added to accelerate the progress and depth of ion exchange, but its ability to compete for free oxygen is very strong. The introduction of massive $Al_2O_3$ will lower the opening degree of the glass structure, make the glass tend to be rigid and increase the fragility of the glass. Meanwhile, it will cause the glass to be devitrified and reduce the thermal expansion coefficient, make it difficult to match with the surrounding materials, excessive surface tension and viscosity of high-temperature, and harder production process of the glass. $Ga_2O_3$ and $Al_2O_3$ have a part of similar functions, which can greatly accelerate the ion exchange rate in the chemical strengthening process, effectively increase the glass strain point to raise the melting temperature slowly, and meanwhile effectively improve the impact strength and toughness of the glass. However, due to the radius ratio effect, excessive $Ga_2O_3$ will reduce the proportion as the network forming body, increase the proportion as the network modifiers, weaken the above advantages, and meanwhile excessively raise the liquidus temperature. Therefore, the adding contents and proportions of $Al_2O_3$ and $Ga_2O_3$ are particularly limited. Based on the overall consideration, in molar percentage, the total content of $Al_2O_3$ and $Ga_2O_3$ is 3~20 mol %, preferably 5~17 mol %, further preferably, in molar percentage, the ratio of the content of $Al_2O_3$ to the sum of the contents of $Al_2O_3$ and $Ga_2O_3$ is 0.7~1.

In the composition for glass provided by the present invention, MgO, CaO, SrO and BaO belong to the alkaline earth metal oxides. They can be added to effectively lower the high-temperature viscosity to improve the meltability, formability and strain point of the glass. Also, MgO and BaO have the characteristics of reducing the fragility of glass. Excessive contents thereof will increase the incidence rates of density increasing, cracking, devitrification and phase separation. Hence, based on comprehensive consideration and taking the total moles of all components as the reference, the glass contains 4~30 mol % of alkaline earth metal oxide selected from any one or more of MgO, CaO, SrO and BaO. Preferably, in molar percentage, the ratio of the sum of the contents of MgO and BaO to the sum of the contents of MgO, CaO, SrO and BaO is greater than 0.5.

In the glass composition provided by the present invention, the rare earth oxide $Y_2O_3$ has a unique ability to improve some properties of the glass, for instance, the bending strength, the strain point of the glass and performance of the glass increase greatly with the addition of the rare earth oxide, to lower the glass fragility, greatly improve the fracture toughness, and reduce the high-temperature viscosity as the rare earth oxide is added, thereby bringing great convenience to the large-scale industrial manufacture of the glass. ZnO can effectively reduce a maximum devitrification temperature of the glass, and can improve the strength and rigidity, increase the chemical resistance, and reduce the fragile value and the thermal expansion coefficient of the glass below a softening point. However, excessive $Y_2O_3$ will promote the decrease of non-bridging oxygen and weaken the above advantages; excessive ZnO will greatly reduce the glass strain point. Hence, taking various factors into comprehensive account and based on the molar content of the composition, the sum of the contents of ZnO and $Y_2O_3$ is 0.1~5 mol %.

In the glass composition provided by the present invention, according to different glass preparation processes, the composition can also contain a fining agent when the glass is molten, and the fining agent is preferably at least one of sulfate, nitrate, tin oxide and stannous oxide; based on the total moles of all components, the content of the fining agent is no more than 1 mol %. There is no special limits for the specific selection of the fining agent, which can be various common choices in the art, for instance, the sulfate can be barium sulfate, and the nitrates can be barium nitrate.

When the glass composition contains barium sulfate and/or barium nitrate and/or strontium nitrate as the fining agent, the contents of barium sulfate and barium nitrate are calculated by barium oxide, and the content of strontium nitrate by strontium oxide. At this time, the content of the RO further includes barium sulfate, barium nitrate and strontium nitrate according to the contents of barium oxide and/or strontium oxide in the fining agent.

preferably, in molar percentage, the content of $B_2O_3$ is 0~20 mol %;

preferably, in molar percentage, the content of $P_2O_5$ is 0~17 mol %;

preferably, in molar percentage, the content of $GeO_2$ is 0~4 mol %;

preferably, in molar percentage, the content of $TeO_2$ is 0~5 mol %;

preferably, in molar percentage, the content of $Al_2O_3$ is 3~18 mol %;

preferably, in molar percentage, the content of $Ga_2O_3$ is 0~4 mol %;

preferably, in molar percentage, the content of ZnO is 0~2.5 mol %;

preferably, in molar percentage, the content of $Y_2O_3$ is 0~3 mol %.

In the further preferred embodiment of the present disclosure:

preferably, in molar percentage, the content of $B_2O_3$ is 2~20 mol %;

preferably, in molar percentage, the content of $P_2O_5$ is 0~14 mol %;

preferably, in molar percentage, the content of $GeO_2$ is 0.1~4 mol %;

preferably, in molar percentage, the content of $TeO_2$ is 0.1~1 mol %;

preferably, in molar percentage, the content of $Al_2O_3$ is 3~14 mol %;

preferably, in molar percentage, the content of $Ga_2O_3$ is 0~3 mol %;

preferably, in molar percentage, the content of ZnO is 0.5~1.4 mol %;

preferably, in molar percentage, the content of $Y_2O_3$ is 0.4~3 mol %.

In a preferred embodiment of the present disclosure, in mole percentage, the value D calculated by Formula (I) is within the range of from −5 to 40, $$D=P_1\times(B_2O_3+P_2O_5+0.5\times GeO_2+0.5\times TeO_2)+P_2\times(1.5\times Y_2O_3+ZnO)+P_3\times(MgO+BaO)+P_4\times(1.5\times CaO+SrO)+P_5\times(Al_2O_3+Ga_2O_3)+P_6\times SiO_2;$$ Formula (I):

in Formula (I), $P_1$ is within the range of from −2 to 0; $P_2$ is within the range of from −5 to −2; $P_3$ is within the range of from −2 to −1; $P_4$ is within the range of from 0 to 1.5, $P_5$ is within the range of from 1.5 to 3; $P_6$ is within the range of from 0 to 0.5;

wherein $SiO_2$, $B_2O_3$, $P_2O_5$, $GeO_2$, $TeO_2$, $Al_2O_3$, $Ga_2O_3$, ZnO, $Y_2O_3$, MgO, CaO, SrO and BaO are all shown in molar percentage in the composition;

preferably, D is within the range of from −2.1 to 32; further preferably, D is within the range of from 2 to 19; still more preferably, $P_1$ is −0.5; $P_2$ is −3; $P_3$ is −1.5; $P_4$ is 1; $P_5$ is 2; $P_6$ is 0.25.

When glass composition provided by the present invention is used for preparing the aluminosilicate glass, the reason why the glass can have the aforementioned excellent comprehensive properties is mainly attributed to mutual cooperation between all components in the composition, especially cooperation among $SiO_2$, $B_2O_3$, $P_2O_5$, $GeO_2$, $TeO_2$, $Al_2O_3$, $Ga_2O_3$, ZnO, $Y_2O_3$, MgO, CaO, SrO and BaO, further especially mutual cooperation between all components having the specific contents.

The second aspect of the present disclosure provides a method for preparing an aluminosilicate glass, the method comprising the steps of melting, forming, annealing and mechanically processing the composition for glass according to the present disclosure.

In the method of the present disclosure, the melting conditions include that the temperature is lower than 1,550° C. and the time is greater than 1 h in a preferred condition. Those skilled in the art could determine the specific melting temperature and time based on the actual conditions.

In the method of the present disclosure, the annealing conditions include that the temperature is higher than 750° C. and the time is greater than 0.1 h in a preferred condition. Those skilled in the art could determine the specific annealing temperature and time based on the actual conditions, which will be well known by them.

In the method provided by the present disclosure, there is no special limits on the mechanical processing methods, which can be various common mechanical processing methods in the art, for instance, the product obtained by annealing can be cut, ground and polished.

In the method provided by the present invention, flat glass with a thickness of >0.1 mm or flexible glass with a thickness of <0.1 mm (the flexible glass with a thickness of <0.1 mm is obtained by the one-step processing method), can be produced by various conventional glass manufacturing methods, such as float process, overflow process and down-draw process, or flexible glass with a thickness of <0.1 mm can be produced by secondary melting and thinning method. Hence, the method can further include the step of preparing the flexible glass with a thickness less than 0.1 mm by conducting the secondary melting and thinning for the product obtained by mechanical processing. There is no specific limit on the specific secondary melting and thinning method, which can be various common methods in the art, for instance, the secondary melting and thinning method can include: producing flat glass with a thickness of less than 1 mm by glass manufacturing methods such as float process, the overflow process, and the down-draw process, etc.; delivering the flat glass to the feeding port of a secondary stretch-forming device, and then delivering it to a stretch-forming furnace at a proper velocity of $V_0$ mm/min, and finally twining in a coil-to-coil mode at a proper velocity of $V_1$ mm/min by a stretcher and roller within a viscosity range from $10^{5.5}$ to $10^7$ P in the controlling stretch-forming area, thereby obtaining an ultrathin flexible glass flat with a thickness of less than 0.1 mm, wherein the stretching velocity $V_1$ is greater than $V_0$.

The third aspect of the present disclosure provides an aluminosilicate glass prepared using the above method.

In a preferred condition, for the aluminosilicate glass provided by the present invention, the fracture toughness $K_{IC}$ is greater than 1.0 MPa·m$^{1/2}$, the thermal expansion coefficient is less than $40\times10^{-7}$/° C. within the range of 50~350° C., the strain point temperature is higher than 700° C., the melting temperature $T_m$ is lower than 1,550° C. corresponding to the viscosity of 200 poises, the difference between the forming temperature $T_4$ and the liquidus temperature $T_1$ is higher than 90° C., and the Young's modulus is less than 80 GPa.

As previously mentioned, the glass with different thicknesses can be produced by different processes. The flat glass with a thickness of >0.1 mm or the flexible glass with a thickness of <0.1 mm can be produced by various conventional glass making methods, such as float process, overflow process and down-draw process, or the flexible glass with a thickness of <0.1 mm can be produced by the secondary melting and thinning method. The aluminosilicate glass with a thickness of 0.05 mm and the curvature radius of less than 3.5 cm.

The fourth aspect of the present disclosure provides the uses of the composition for glass or the aluminosilicate glass in the preparation of a display device and/or a solar cell, the uses is preferred in the preparation of materials of a substrate glass substrate and/or a glass film material for screen surface protection for the panel display product, a substrate glass substrate and/or a surface encapsulated glass and/or a glass film material for the screen surface protection for the flexible panel display product, a substrate glass substrate for the flexible solar cell, and other uses of the materials requiring low fragility and high heat resistance.

EXAMPLES

The present invention will be elaborated by the following embodiments. In the following embodiments, unless noted otherwise, all applied materials can be purchased; unless noted otherwise, all applied methods are common methods in the art.

Referring to ASTM E-228, a horizontal dilatometer is used for measuring the thermal expansion coefficient of the glass at 50-350° C. in a unit of $10^{-7}$/° C.

Referring to ASTM C-623, the Young's modulus of the glass is determined in a unit of GPa.

Referring to ASTM E-1820, the fracture toughness $K_{IC}$ of the glass is determined in a unit of MPa·m$^{1/2}$.

Referring to ASTM C-336, the strain point of the glass is determined by the annealing/strain point tester in a unit of °C.

Referring to ASTM C-829, the maximum temperature of glass devitrification is determined by a temperature gradient method, and the liquidus temperature $T_1$ is in a unit of °C.

Referring to ASTM C-965, a high-temperature viscosity-temperature curve of the glass is determined by a rotary high-temperature viscosimeter, and the melting temperature $T_m$ corresponding to the viscosity of 200 P is in a unit of °C. The forming temperature $T_4$ corresponding to the viscosity of 40,000 P is in °C.

When a fragile factor value D is calculated by Formula (I), $P_1$ is −0.5, $P_2$ is −3, $P_3$ is −1.5, $P_4$ is 1, $P_5$ is 2, and $P_6$ is 0.25.

Examples 1-32

All components weighed based on the dosages shown in Table 1 are mixed uniformly, poured into a platinum crucible, and then heated in a resistance furnace at 1,530° C. for 4 h, and finally stirred to discharge bubbles by a platinum rod. The molten glass is poured into a stainless steel cast iron grinding tool to shape as a specified blocky glassware; and then the glassware is annealed for 2 h in a annealing furnace at 760° C., and cooled to 25° C. after the power is turned off. The glassware is cut, ground and polished, then washed with deionized water and dried to obtain a glass product with a thickness of 0.5 mm. Various properties of all glass products are determined respectively (see Tables 1-3 for results).

TABLE 1

| Composition (mol %) | | 1 | 2 | 3 | 4 | 5 | 6 | 7 | 8 | 9 |
|---|---|---|---|---|---|---|---|---|---|---|
| | $SiO_2$ | 57 | 44 | 71 | 57 | 53 | 53 | 54 | 54 | 54 |
| | $B_2O_3$ | 8 | 18 | 4 | 2 | 20 | 8 | 8 | 8 | 8 |
| | $P_2O_5$ | 5 | 8 | 2 | 11 | 2 | 14 | 9 | 8 | 8 |
| | $GeO_2$ | 2 | 2 | 2 | 2 | 2 | 2 | 0.1 | 4 | 2 |
| | $TeO_2$ | 0.8 | 0.5 | 0.8 | 0.5 | 0.5 | 0.5 | 0.5 | 0.1 | 1 |
| | $Al_2O_3$ | 10 | 10 | 6 | 10 | 5 | 5 | 10.9 | 8.4 | 9.5 |
| | $Ga_2O_3$ | 2 | 2 | 2 | 2 | 2 | 2 | 2 | 2 | 2 |
| | MgO | 4 | 4 | 3 | 4 | 4 | 4 | 4 | 4 | 4 |
| | CaO | 3 | 3 | 2 | 3 | 3 | 3 | 3 | 3 | 3 |
| | SrO | 2 | 2 | 2 | 2 | 2 | 2 | 2 | 2 | 2 |
| | BaO | 4 | 4 | 3 | 4 | 4 | 4 | 4 | 4 | 4 |
| | ZnO | 1 | 1 | 1 | 1 | 1 | 1 | 1 | 1 | 1 |
| | $Y_2O_3$ | 1 | 1 | 1 | 1 | 1 | 1 | 1 | 1 | 1 |
| Fining agent | $SnO_2$ | 0.1 | 0 | 0.2 | 0.1 | 0.1 | 0.1 | 0.1 | 0.1 | 0 |
| | SnO | 0 | 0 | 0 | 0.1 | 0.1 | 0.1 | 0.1 | 0.2 | 0 |
| | $BaSO_4$ (by BaO) | 0 | 0.5 | 0 | 0.2 | 0.2 | 0.2 | 0.1 | 0 | 0.5 |
| | $Ba(NO_3)_2$ (by BaO) | 0.1 | 0 | 0 | 0 | 0.1 | 0.1 | 0 | 0.2 | 0 |
| | $Sr(NO_3)_2$ (by SrO) | 0 | 0 | 0 | 0.1 | 0 | 0 | 0.2 | 0 | 0 |
| $SiO_2 + B_2O_3 + P_2O_5 + GeO_2 + TeO_2$ | | 72.8 | 72.5 | 79.8 | 72.5 | 77.5 | 77.5 | 71.6 | 74.1 | 73 |
| $Al_2O_3 + Ga_2O_3$ | | 12 | 12 | 8 | 12 | 7 | 7 | 12.9 | 10.4 | 11.5 |
| $(B_2O_3 + P_2O_5)/(B_2O_3 + P_2O_5 + GeO_2 + TeO_2)$ | | 0.82 | 0.91 | 0.68 | 0.84 | 0.9 | 0.9 | 0.97 | 0.80 | 0.84 |
| $Al_2O_3/(Al_2O_3 + Ga_2O_3)$ | | 0.83 | 0.83 | 0.75 | 0.83 | 0.71 | 0.71 | 0.84 | 0.81 | 0.83 |
| $ZnO + Y_2O_3$ | | 2 | 2 | 2 | 2 | 2 | 2 | 2 | 2 | 2 |
| RO | | 13.1 | 13.5 | 10 | 13.3 | 13.3 | 13.3 | 13.3 | 13.2 | 13.5 |
| (MgO + BaO)/RO | | 0.62 | 0.63 | 0.6 | 0.62 | 0.62 | 0.62 | 0.61 | 0.62 | 0.63 |
| Thermal expansion coefficient | $×10^{-7}$/° C. | 26.66 | 32.18 | 35.78 | 32.66 | 37.19 | 34.39 | 30.05 | 35.02 | 33.07 |
| Young's modulus | Gpa | 69.6 | 66.04 | 72.99 | 71.37 | 56.99 | 67.17 | 70.13 | 73.11 | 70.53 |
| Melting temperature $T_m$ | ° C. | 1482 | 1526 | 1536 | 1518 | 1531 | 1524 | 1499 | 1507 | 1495 |
| Forming temperature $T_4$ | ° C. | 1138 | 1010 | 1082 | 1168 | 1239 | 1254 | 1124 | 1068 | 1018 |
| Liquidus temperature $T_1$ | ° C. | 1010 | 900 | 980 | 1030 | 1110 | 1120 | 970 | 950 | 905 |
| $T_4 - T_1$ | ° C. | 128 | 110 | 102 | 138 | 129 | 134 | 154 | 118 | 113 |
| Strain point | ° C. | 706 | 730 | 717 | 743 | 723 | 713 | 746 | 730 | 729 |
| Value D | | 17.9 | 7.6 | 18.6 | 17.9 | 2.2 | 2.2 | 17.7 | 12.0 | 14.0 |
| Fracture toughness $K_{IC}$ | | 5.06 | 5.02 | 3.57 | 2.85 | 5.93 | 5.65 | 2.87 | 3.04 | 2.98 |

TABLE 2

| Composition (mol %) | | EXAMPLES | | | | | | | | | |
|---|---|---|---|---|---|---|---|---|---|---|---|
| | | 10 | 11 | 12 | 13 | 14 | 15 | 16 | 17 | 18 | 19 |
| | $SiO_2$ | 53 | 57 | 53 | 52 | 50 | 54 | 52 | 57 | 48 | 69 |
| | $B_2O_3$ | 8 | 12 | 8 | 12 | 12 | 9 | 8 | 8 | 7 | 8 |
| | $P_2O_5$ | 5 | 9 | 8 | 8 | 8 | 8 | 8 | 5 | 3 | 5 |
| | $GeO_2$ | 2 | 2 | 2 | 2.5 | 2 | 2 | 2 | 2.5 | 2 | 2 |
| | $TeO_2$ | 0.5 | 0.5 | 0.5 | 0.5 | 0.5 | 0.5 | 0.5 | 0.5 | 0.9 | 0.8 |
| | $Al_2O_3$ | 14 | 3 | 10 | 8 | 10 | 10 | 10 | 10 | 5 | 7 |
| | $Ga_2O_3$ | 2 | 1 | 3 | 2 | 2 | 2 | 2 | 2 | 2 | 2 |
| | MgO | 4 | 4 | 4 | 4 | 4 | 4 | 4 | 4 | 8 | 1 |
| | CaO | 3 | 3 | 3 | 3 | 3 | 3 | 3 | 3 | 8 | 1 |
| | SrO | 2 | 2 | 2 | 2 | 2 | 2 | 2 | 2 | 6 | 1 |
| | BaO | 4 | 4 | 4 | 4 | 4 | 4 | 4 | 4 | 7.9 | 1 |
| | ZnO | 1 | 1 | 1 | 0.5 | 1.4 | 1 | 1 | 1 | 1 | 1 |
| | $Y_2O_3$ | 1 | 1 | 1 | 1 | 1 | 0.4 | 3 | 1 | 1 | 1 |
| Fining agent | $SnO_2$ | 0.1 | 0.1 | 0.1 | 0.1 | 0 | 0.1 | 0.1 | 0 | 0.1 | 0.1 |
| | SnO | 0.1 | 0.1 | 0.1 | 0.1 | 0 | 0 | 0.1 | 0 | 0 | 0 |
| | $BaSO_4$ (by BaO) | 0.1 | 0.1 | 0.1 | 0.1 | 0 | 0 | 0.1 | 0 | 0 | 0 |
| | $Ba(NO_3)_2$ (by BaO) | 0.1 | 0.1 | 0.1 | 0.1 | 0.1 | 0 | 0.1 | 0 | 0.1 | 0.1 |
| | $Sr(NO_3)_2$ (by SrO) | 0.1 | 0.1 | 0.1 | 0.1 | 0 | 0 | 0.1 | 0 | 0 | 0 |
| $SiO_2 + B_2O_3 + P_2O_5 + GeO_2 + TeO_2$ | | 68.5 | 80.5 | 71.5 | 75 | 72.5 | 73.5 | 70.5 | 73 | 60.9 | 84.8 |
| $Al_2O_3 + Ga_2O_3$ | | 16 | 4 | 13 | 10 | 12 | 12 | 12 | 12 | 7 | 9 |
| $(B_2O_3 + P_2O_5)/(B_2O_3 + P_2O_5 + GeO_2 + TeO_2)$ | | 0.84 | 0.89 | 0.86 | 0.87 | 0.89 | 0.87 | 0.86 | 0.81 | 0.78 | 0.82 |
| $Al_2O_3/(Al_2O_3 + Ga_2O_3)$ | | 0.88 | 0.75 | 0.77 | 0.8 | 0.83 | 0.83 | 0.83 | 0.83 | 0.71 | 0.78 |
| $ZnO + Y_2O_3$ | | 2 | 2 | 2 | 1.5 | 2.4 | 1.4 | 4 | 2 | 2 | 2 |
| RO | | 13.3 | 13.3 | 13.3 | 13.3 | 13.1 | 13 | 13.3 | 13 | 30 | 4.1 |
| (MgO + BaO)/RO | | 0.62 | 0.62 | 0.62 | 0.62 | 0.62 | 0.62 | 0.62 | 0.62 | 0.53 | 0.51 |
| Thermal expansion coefficient | $\times 10^{-7}/°C$ | 28.31 | 36.15 | 34.36 | 32.72 | 29.87 | 30.77 | 35.21 | 36.68 | 37.78 | 38.41 |
| Young's modulus | Gpa | 71.5 | 65.0 | 69.8 | 67.5 | 67.9 | 68.2 | 72.8 | 70.1 | 74.4 | 65.2 |
| Melting temperature Tm | °C | 1501 | 1499 | 1468 | 1455 | 1431 | 1487 | 1433 | 1525 | 1407 | 1545 |
| Forming temperature T4 | °C | 1181 | 1083 | 1120 | 1086 | 1075 | 1127 | 1089 | 1191 | 1027 | 1228 |
| Liquidus temperature $T_1$ | °C | 1030 | 970 | 990 | 960 | 950 | 1005 | 973 | 1030 | 860 | 1070 |
| $T_4 - T_1$ | °C | 151 | 113 | 130 | 126 | 125 | 122 | 116 | 161 | 167 | 158 |
| Strain point | °C | 768 | 707 | 738 | 706 | 712 | 728 | 739 | 744 | 710 | 765 |
| Value D | | 24.9 | −2.1 | 17.4 | 10.6 | 11.5 | 18.1 | 6.2 | 18.0 | 6.8 | 19.9 |
| Fracture toughness $K_{IC}$ | | 2.26 | 1.02 | 2.57 | 2.45 | 1.93 | 2.37 | 2.65 | 2.04 | 2.65 | 1.43 |

TABLE 3

| Composition (mol %) | | EXAMPLES | | | | | | | | | | | | |
|---|---|---|---|---|---|---|---|---|---|---|---|---|---|
| | | 20 | 21 | 22 | 23 | 24 | 25 | 26 | 27 | 28 | 29 | 30 | 31 | 32 |
| | $SiO_2$ | 40 | 59 | 57 | 50 | 55 | 55 | 50 | 49 | 56 | 52 | 52 | 49 | 54 |
| | $B_2O_3$ | 18 | 0 | 18 | 8 | 6 | 8 | 8 | 8 | 12 | 8 | 12 | 12 | 9 |
| | $P_2O_5$ | 12 | 11 | 0 | 17 | 8 | 8.5 | 8 | 5 | 9 | 8 | 8 | 8 | 8 |
| | $GeO_2$ | 2 | 2 | 2 | 2 | 0 | 3 | 2 | 2 | 2 | 2 | 2.5 | 2 | 2 |
| | $TeO_2$ | 0.5 | 0.5 | 0.5 | 0.5 | 2.5 | 0 | 5 | 0.5 | 0.5 | 0.5 | 1 | 0.4 | 0.5 |
| | $Al_2O_3$ | 10 | 10 | 5 | 5 | 11 | 8 | 9.5 | 18 | 5 | 10 | 8 | 10 | 10 |
| | $Ga_2O_3$ | 2 | 2 | 2 | 2 | 2 | 2 | 2 | 2 | 0 | 4 | 2 | 2 | 2 |
| | MgO | 4 | 4 | 4 | 4 | 4 | 4 | 4 | 4 | 4 | 4 | 4 | 4 | 4 |
| | CaO | 3 | 3 | 3 | 3 | 3 | 3 | 3 | 3 | 3 | 3 | 3 | 3 | 3 |
| | SrO | 2 | 2 | 2 | 2 | 2 | 2 | 2 | 2 | 2 | 2 | 2 | 2 | 2 |
| | BaO | 4 | 4 | 4 | 4 | 4 | 4 | 4 | 4 | 4 | 4 | 4 | 4 | 4 |
| | ZnO | 1 | 1 | 1 | 1 | 1 | 1 | 1 | 1 | 1 | 0 | 1 | 2.5 | 1 |
| | $Y_2O_3$ | 1 | 1 | 1 | 1 | 1 | 1 | 1 | 1 | 1 | 1 | 1 | 1 | 0 |
| Fining agent | $SnO_2$ | 0 | 0.1 | 0.1 | 0.1 | 0.1 | 0.1 | 0 | 0.1 | 0.1 | 0.1 | 0.1 | 0 | 0.1 |
| | SnO | 0 | 0.1 | 0.1 | 0.1 | 0.1 | 0.2 | 0 | 0.1 | 0.1 | 0.1 | 0.1 | 0 | 0.1 |
| | $BaSO_4$ | 0.5 | 0.2 | 0.2 | 0.2 | 0.1 | 0 | 0.5 | 0.1 | 0.1 | 0.1 | 0.1 | 0 | 0.1 |

TABLE 3-continued

| Composition (mol %) | | EXAMPLES | | | | | | | | | | | |
|---|---|---|---|---|---|---|---|---|---|---|---|---|---|
| | | 20 | 21 | 22 | 23 | 24 | 25 | 26 | 27 | 28 | 29 | 30 | 31 | 32 |
| (by BaO) Ba(NO$_3$)$_2$ (by BaO) | | 0 | 0 | 0.1 | 0.1 | 0 | 0.2 | 0 | 0.1 | 0.1 | 0.1 | 0.1 | 0.1 | 0.1 |
| Sr(NO$_3$)$_2$ (by SrO) | | 0 | 0.1 | 0 | 0 | 0.2 | 0 | 0 | 0.1 | 0.1 | 0.1 | 0.1 | 0 | 0.1 |
| SiO$_2$ + B$_2$O$_3$ + P$_2$O$_5$ + GeO$_2$ + TeO$_2$ | | 72.5 | 72.5 | 77.5 | 77.5 | 71.5 | 74.5 | 73 | 64.5 | 79.5 | 70.5 | 75.5 | 71.5 | 73.5 |
| Al$_2$O$_3$ + Ga$_2$O$_3$ | | 12 | 12 | 7 | 7 | 13 | 10 | 11.5 | 20 | 5 | 14 | 10 | 12 | 12 |
| (B$_2$O$_3$ + P$_2$O$_5$)/(B$_2$O$_3$ + P$_2$O$_5$ + GeO$_2$ + TeO$_2$) | | 0.92 | 0.81 | 0.88 | 0.91 | 0.85 | 0.85 | 0.7 | 0.84 | 0.89 | 0.86 | 0.85 | 0.89 | 0.87 |
| Al$_2$O$_3$/Al$_2$O$_3$ + Ga$_2$O$_3$) | | 0.83 | 0.83 | 0.71 | 0.71 | 0.85 | 0.8 | 0.83 | 0.9 | 1 | 0.71 | 0.8 | 0.83 | 0.83 |
| ZnO + Y$_2$O$_3$ | | 2 | 2 | 2 | 2 | 2 | 2 | 2 | 2 | 2 | 2 | 1 | 3.5 | 1 |
| RO | | 13.5 | 13.3 | 13.3 | 13.3 | 13.3 | 13.2 | 13.5 | 13.3 | 13.3 | 13.3 | 13.3 | 13.1 | 13.3 |
| (MgO + BaO)/RO | | 0.63 | 0.62 | 0.62 | 0.62 | 0.61 | 0.62 | 0.63 | 0.62 | 0.62 | 0.62 | 0.62 | 0.62 | 0.62 |
| Thermal expansion coefficient | ×10$^{-7}$/° C. | 31.01 | 37.53 | 36.54 | 39.29 | 32.99 | 33.27 | 39.22 | 35.22 | 35.26 | 35.91 | 38.22 | 31.67 | 37.51 |
| Young's modulus | Gpa | 70.4 | 77.7 | 69.3 | 71.9 | 76.8 | 74.2 | 74.4 | 78.1 | 70.7 | 74.9 | 72.5 | 72.9 | 72.6 |
| Melting temperature T$_m$ | ° C. | 1436 | 1521 | 1548 | 1460 | 1478 | 1495 | 1438 | 1460 | 1492 | 1454 | 1453 | 1424 | 1495 |
| Forming temperature T$_4$ | ° C. | 1018 | 1240 | 1254 | 1039 | 1234 | 1204 | 1165 | 1257 | 1172 | 1204 | 1178 | 1150 | 1223 |
| Liquidus temperature T$_l$ | ° C. | 890 | 1095 | 1045 | 945 | 1050 | 1030 | 960 | 1070 | 1030 | 1020 | 1000 | 980 | 1050 |
| T$_4$ − T$_l$ | ° C. | 128 | 145 | 209 | 94 | 184 | 174 | 205 | 187 | 142 | 184 | 178 | 170 | 173 |
| Strain point | ° C. | 734 | 769 | 712 | 707 | 739 | 703 | 719 | 770 | 707 | 720 | 716 | 712 | 707 |
| Value D | | 4.6 | 19.4 | 5.2 | −0.1 | 19.2 | 11.5 | 12.0 | 31.9 | −0.3 | 19.2 | 11.9 | 8.0 | 19.7 |
| Fracture toughness K$_{IC}$ | | 2.46 | 2.02 | 2.57 | 1.75 | 1.43 | 2.55 | 2.37 | 1.24 | 1.48 | 1.35 | 2.27 | 2.46 | 1.25 |

Comparative Examples 1-7

Differing from the preparation of the glass product prepared by the methods in examples 1~32, the mixture ingredients are shown in Table 4 and the product property determination results are shown in Table 5.

TABLE 4

| Composition (mol %) | | Comparative example | | | | | | |
|---|---|---|---|---|---|---|---|---|
| | | 1 | 2 | 3 | 4 | 5 | 6 | 7 |
| SiO$_2$ | | 72 | 65 | 50 | 54 | 50 | 63 | 40 |
| B$_2$O$_3$ | | 8 | 13 | 2 | 8 | 8 | 12 | 6 |
| P$_2$O$_5$ | | 4 | 2 | 8 | 8 | 8 | 5 | 2 |
| GeO$_2$ | | 1 | 2 | 2 | 4 | 2 | 2 | 2 |
| TeO$_2$ | | 0.8 | 0.5 | 0.5 | 0.5 | 1 | 0.5 | 0.5 |
| Al$_2$O$_3$ | | 6 | 2 | 20 | 10 | 9.5 | 10 | 14 |
| Ga$_2$O$_3$ | | 1 | 0 | 2 | 2 | 2 | 2 | 1 |
| MgO | | 1 | 4 | 4 | 4 | 4 | 1 | 8 |
| CaO | | 1 | 3 | 3 | 3 | 3 | 1 | 8 |
| SrO | | 2 | 2 | 2 | 2 | 2 | 1 | 8 |
| BaO | | 0.7 | 4 | 4 | 4 | 4 | 0 | 8 |
| ZnO | | 1 | 1 | 1 | 0 | 2 | 1 | 1 |
| Y$_2$O$_3$ | | 1 | 1 | 1 | 0 | 4 | 1 | 1 |
| Fining agent | SnO$_2$ | 0.1 | 0.1 | 0.1 | 0.1 | 0 | 0.1 | 0.1 |
| | SnO | 0.1 | 0.1 | 0.2 | 0.2 | 0 | 0.1 | 0.1 |
| | BaSO$_4$ (by BaO) | 0.2 | 0.2 | 0 | 0 | 0.5 | 0.1 | 0.1 |
| | Ba(NO$_3$)$_2$ (by BaO) | 0.1 | 0.1 | 0.2 | 0.2 | 0 | 0.1 | 0.1 |
| | Sr(NO$_3$)$_2$ (by SrO) | 0 | 0 | 0 | 0 | 0.1 | 0.1 | 0.1 |
| SiO$_2$ + B$_2$O$_3$ + P$_2$O$_5$ + GeO$_2$ + TeO$_2$ | | 85.8 | 82.5 | 62.5 | 74.5 | 69 | 82.5 | 50.5 |

TABLE 4-continued

| Composition (mol %) | | Comparative example | | | | | | |
|---|---|---|---|---|---|---|---|---|
| | | 1 | 2 | 3 | 4 | 5 | 6 | 7 |
| $Al_2O_3 + Ga_2O_3$ | | 7 | 2 | 22 | 12 | 11.5 | 12 | 15 |
| $(B_2O_3 + P_2O_5)/(B_2O_3 + P_2O_5 + GeO_2 + TeO_2)$ | | 0.87 | 0.86 | 0.8 | 0.78 | 0.84 | 0.87 | 0.76 |
| $Al_2O_3/Al_2O_3 + Ga_2O_3)$ | | 0.86 | 1 | 0.91 | 0.83 | 0.83 | 0.83 | 0.93 |
| $ZnO + Y_2O_5$ | | 2 | 2 | 2 | 0 | 6 | 2 | 2 |
| RO | | 5 | 13.3 | 13.2 | 13.2 | 13.5 | 3.3 | 32.3 |
| $(MgO + BaO)/RO$ | | 0.40 | 0.62 | 0.62 | 0.62 | 0.63 | 0.36 | 0.5 |
| Thermal expansion coefficient | $\times 10^{-7}/°C.$ | 30.98 | 46.32 | 42.97 | 37.62 | 38.15 | 34.97 | 47.81 |
| Young's modulus | Gpa | 69.7 | 60.9 | 87.2 | 73.2 | 79.1 | 69.5 | 85.2 |
| Melting temperature Tm | °C. | 1620 | 1575 | 1755 | 1557 | 1524 | 1643 | 1479 |
| Forming temperature T4 | °C. | 1277 | 1247 | 1381 | 1231 | 1194 | 1279 | 1097 |
| Liquidus temperature $T_1$ | °C. | 1250 | 1190 | 1410 | 1150 | 1160 | 1200 | 1220 |
| $T_4 - T_1$ | °C. | 27 | 57 | −29 | 81 | 34 | 79 | −123 |
| Strain point | °C. | 671 | 617 | 816 | 715 | 688 | 697 | 671 |
| Value D | | 18.6 | −1.3 | 37.6 | 22.6 | −3.5 | 23.9 | 23.7 |
| Fracture toughness $K_{IC}$ | | 0.96 | 0.77 | 0.82 | 0.84 | 0.78 | 0.73 | 0.99 |

It can be seen from comparison for data in Tables 1-3 and 4 that the glass products prepared by the method provided by the present disclosure are obviously low in fragility and high in fracture toughness. The composition for glass or the aluminosilicate glass provided by the present invention can be used in the preparation of the display device and/or the solar cell, in particular in the preparation of materials of the substrate glass substrate and/or the glass film material for the screen surface protection for the panel display product, the substrate glass substrate and/or the surface encapsulated glass and/or the glass film material for the screen surface protection or the flexible panel display product, the substrate glass substrate for the flexible solar cell, and other uses requiring the glass materials with low fragility and high toughness.

The glass is prepared by the methods in a part of examples and comparative examples, and then is subject to the secondary melting and thinning, wherein the secondary melting and thinning method includes: delivering the flat glass with a thickness of 0.7 mm and the width of 50 mm obtained by cutting, grinding and polishing to a feeding port of a secondary stretch-forming device, and then delivering it to a stretch-forming furnace at a velocity of $V_0$ mm/min, and twining in a coil-to-coil mode at a proper velocity of $V_1$ mm/min by a stretcher and roller with a viscosity P in the controlling stretch-forming area, thereby obtaining a flexible glass flat with a thickness of d1 and a width of d2. The minimum curvature radiuses of various glass products are determined using a curvature radius tester. See Table 5 for conditions and corresponding minimum radiuses in a part of embodiments.

TABLE 5

| EXAMPLES | Velocity $V_0$ (mm/min) | Viscosity P (P) | Velocity $V_1$ (mm/min) | Thickness d1 (mm) | Width d2 (mm) | Curvature radius (cm) |
|---|---|---|---|---|---|---|
| 1 | 5 | $10^{6.4}$ | 269 | 0.05 | 13 | 0.9 |
| 2 | 5 | $10^{5.5}$ | 175 | 0.05 | 20 | 0.4 |
| 3 | 5 | $10^{6.8}$ | 292 | 0.05 | 12 | 1.3 |
| 4 | 5 | $10^6$ | 389 | 0.05 | 9 | 1.3 |
| 5 | 5 | $10^6$ | 250 | 0.05 | 14 | 0.8 |
| 6 | 5 | $10^6$ | 500 | 0.05 | 7 | 1.1 |
| 7 | 5 | $10^6$ | 700 | 0.05 | 5 | 1.3 |
| 8 | 5 | $10^6$ | 318 | 0.05 | 11 | 2.1 |
| 9 | 5 | $10^6$ | 250 | 0.05 | 14 | 1.9 |
| 10 | 5 | $10^6$ | 389 | 0.05 | 9 | 2.8 |
| 11 | 5 | $10^6$ | 438 | 0.05 | 8 | 3.2 |
| 12 | 5 | $10^6$ | 250 | 0.05 | 14 | 2.6 |
| 13 | 5 | $10^6$ | 318 | 0.05 | 11 | 1.9 |
| 14 | 5 | $10^6$ | 350 | 0.05 | 10 | 1.7 |
| 15 | 5 | $10^6$ | 500 | 0.05 | 7 | 2.3 |
| 16 | 5 | $10^6$ | 250 | 0.05 | 14 | 1.3 |
| 17 | 5 | $10^6$ | 219 | 0.05 | 16 | 2.4 |
| 18 | 5 | $10^6$ | 206 | 0.05 | 17 | 1.5 |
| 19 | 5 | $10^6$ | 389 | 0.05 | 9 | 1.7 |
| 20 | 5 | $10^6$ | 292 | 0.05 | 12 | 1.1 |
| 21 | 5 | $10^6$ | 233 | 0.05 | 15 | 2.3 |
| 22 | 5 | $10^6$ | 194 | 0.05 | 18 | 1.3 |
| 23 | 5 | $10^6$ | 233 | 0.05 | 15 | 3.4 |
| 24 | 5 | $10^6$ | 250 | 0.05 | 14 | 3.1 |
| 25 | 5 | $10^6$ | 438 | 0.05 | 8 | 2.2 |
| 26 | 5 | $10^6$ | 389 | 0.05 | 9 | 1.8 |
| 27 | 5 | $10^{6.6}$ | 583 | 0.05 | 6 | 3.4 |
| 28 | 5 | $10^6$ | 875 | 0.05 | 4 | 3.3 |

TABLE 5-continued

| | | | | | | |
|---|---|---|---|---|---|---|
| 29 | 5 | $10^{6.6}$ | 583 | 0.05 | 6 | 3.2 |
| 30 | 5 | $10^{6.3}$ | 438 | 0.05 | 8 | 3 |
| 31 | 5 | $10^{6.3}$ | 233 | 0.05 | 15 | 2.4 |
| 32 | 5 | $10^{6.3}$ | 175 | 0.05 | 20 | 2.7 |

| Comparative example | Velocity $V_0$ (mm/min) | Viscosity P (P) | Velocity $V_1$ (mm/min) | Thickness d1 (mm) | Width d2 (mm) | Curvature radius (cm) |
|---|---|---|---|---|---|---|
| 1 | 5 | $10^{5.6}$ | 438 | 0.05 | 8 | 16.9 |
| 2 | 5 | $10^{6}$ | 1167 | 0.05 | 3 | 15.5 |
| 3 | 5 | $10^{5.5}$ | 700 | 0.05 | 5 | 23.6 |
| 4 | 5 | $10^{6}$ | 389 | 0.05 | 9 | 30.7 |
| 5 | 5 | $10^{6}$ | 292 | 0.05 | 12 | 41.9 |
| 6 | 5 | $10^{6}$ | 219 | 0.05 | 16 | 36.7 |
| 7 | 5 | $10^{6.5}$ | 318 | 0.05 | 11 | 41.1 |

It can be seen from the results in Table 5 that the aluminosilicate glass with a thickness of 0.05 mm and the curvature radius of less than 3.5 cm can be obtained by the method provided by the present invention.

The preferred embodiments of the present disclosure are elaborated above, but the present disclosure is not limited to specific details in the above embodiments. The technical solution of the present disclosure can be varied simply within the technical idea range, and these simple variants belong to the protection scope of the present disclosure.

In addition, it should be noted that all specific technical features depicted in the above specific implementations can be combined by any appropriate means without contradiction. In an attempt to avoid unnecessary repetition, the present disclosure will not state various possible combination ways additionally.

Besides, different embodiments of the present disclosure can be combined arbitrarily, and should be regarded as the contents disclosed by the present disclosure without departing from the idea of the present disclosure.

The invention claimed is:

1. A composition for glass, in molar percentage, in the composition, the total content of $SiO_2$, $B_2O_3$, $P_2O_5$, $GeO_2$ and $TeO_2$ is 60~85 mol %; the total content of $Al_2O_3$ and $Ga_2O_3$ is 3~20 mol %; the total content of ZnO and $Y_2O_3$ is 0.1~5 mol %; and the total content of alkaline earth metal oxide is 4~30 mol %;
wherein, in molar percentage, the value D calculated by Formula (I) is within the range of from 2 to 19, $D=P_1\times(B_2O_3+P_2O_5+0.5\times GeO_2+0.5\times TeO_2)+P_2\times(1.5\times Y_2O_3+ZnO)+P_3\times(MgO+BaO)+P_4\times(1.5\times CaO+SrO)+P_5\times(Al_2O_3+Ga_2O_3)+P_6\times SiO_2;$  Formula (I):

in Formula (I), $P_1$ is −0.5, $P_2$ is −3, $P_3$ is −1.5, $P_4$ is 1, $P_5$ is 2, and $P_6$ is 0.25;
wherein $SiO_2$, $B_2O_3$, $P_2O_5$, $GeO_2$, $TeO_2$, $Al_2O_3$, $Ga_2O_3$, ZnO, $Y_2O_3$, MgO, CaO, SrO and BaO are all shown in molar percentage in the composition;
in molar content, the sum of the contents of $B_2O_3$ and $P_2O_5$ is greater than 0, and a ratio of the sum of the contents of $B_2O_3$ and $P_2O_5$ to the sum of the contents of $B_2O_3$, $P_2O_5$, $GeO_2$ and $TeO_2$ is 0.86~1;
in molar content, the ratio of the content of $Al_2O_3$ to the sum of the contents of $Al_2O_3$ and $Ga_2O_3$ is 0.7~1;
in molar content, the ratio of the sum of the contents of MgO and BaO to the sum of the contents of MgO, CaO, SrO and BaO is greater than 0.5;
for the aluminosilicate glass, a thermal expansion coefficient is less than $40\times10^{-7}$/° C. within the range of 50~350° C., the difference between a forming temperature $T_4$ and a liquidus temperature $T_1$ is higher than 90° C., and the Young's modulus is lower than 80 GPa;
the fracture toughness $K_{IC}$ of the aluminosilicate glass is greater than 1.0 MPa·m$^{1/2}$.

2. The composition for glass according to claim 1, wherein the alkaline earth metal oxide is selected from any one or more of MgO, CaO, SrO and BaO.

3. The composition for glass according to claim 1, wherein, in molar percentage, the sum of the contents of $B_2O_3$ and $P_2O_5$ to the sum of the contents of $B_2O_3$, $P_2O_5$, $GeO_2$ and $TeO_2$ is 0.86~0.92.

4. The composition for glass according to claim 1, wherein, in molar percentage, the content of $SiO_2$ is 40 mol % or more;
in molar percentage, the content of $B_2O_3$ is 0~20 mol %;
in molar percentage, the content of $P_2O_5$ is 0~17 mol %;
in molar percentage, the content of $GeO_2$ is 0~4 mol %;
in molar percentage, the content of $TeO_2$ is 0~5 mol %;
in molar percentage, the content of $Al_2O_3$ is 3~18 mol %;
in molar percentage, the content of $Ga_2O_3$ is 0~4 mol %;
in molar percentage, the content of ZnO is 0~2.5 mol %;
in molar percentage, the content of $Y_2O_3$ is 0~3 mol %.

5. The composition for glass according to claim 4, wherein, in molar percentage, the content of $SiO_2$ is 44 mol % or more but less than 72 mol %;
in molar percentage, the content of $B_2O_3$ is 2~20 mol %;
in molar percentage, the content of $P_2O_5$ is 0~14 mol %;
in molar percentage, the content of $GeO_2$ is 0.1~4 mol %;
in molar percentage, the content of $TeO_2$ is 0.1~1 mol %;
in molar percentage, the content of $Al_2O_3$ is 3~14 mol %;
in molar percentage, the content of $Ga_2O_3$ is 0~3 mol %;
in molar percentage, the content of ZnO is 0.5~1.4 mol %;
in molar percentage, the content of $Y_2O_3$ is 0.4~3 mol %.

6. The composition for glass according to claim 1, wherein, in molar percentage, the total content of $Al_2O_3$ and $Ga_2O_3$ is 5~17 mol %.

7. Uses of the composition for glass according to claim 1 in the preparation of a display device and/or a solar cell.

8. Uses according to claim 7, wherein, the uses are
in the preparation of materials of a glass substrate and/or a glass film material for screen surface protection for panel display products, a substrate glass substrate and/or a surface encapsulated glass and/or a glass film material for screen surface protection for flexible panel display products, and a substrate glass substrate for flexible solar cells.

* * * * *